United States Patent
Frank et al.

(10) Patent No.: US 6,825,538 B2
(45) Date of Patent: Nov. 30, 2004

(54) SEMICONDUCTOR DEVICE USING AN INSULATING LAYER HAVING A SEED LAYER

(75) Inventors: Martin Michael Frank, Summit, NJ (US); Yves Chabal, Holmdel, NJ (US); Glen David Wilk, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/300,365

(22) Filed: Nov. 20, 2002

(65) Prior Publication Data

US 2004/0094809 A1 May 20, 2004

(51) Int. Cl.[7] .................... H01L 29/94; H01L 31/113
(52) U.S. Cl. .................... 257/411; 257/410; 257/296
(58) Field of Search .................... 257/411, 410, 257/296, 368, 297, 310; 438/216, 261, 287, 591, 595, 954, 981

(56) References Cited

U.S. PATENT DOCUMENTS

| 5,891,798 | A | | 4/1999 | Doyle et al. |
|---|---|---|---|---|
| 6,265,297 | B1 | | 7/2001 | Powell |
| 6,335,238 | B1 | | 1/2002 | Hanttangady et al. |
| 2002/0089023 | A1 | * | 7/2002 | Yu et al. ...................... 257/411 |
| 2002/0100946 | A1 | * | 8/2002 | Muller et al. ................ 257/410 |
| 2002/0151142 | A1 | * | 10/2002 | Callegari et al. ............ 438/287 |
| 2002/0153579 | A1 | * | 10/2002 | Yamamoto .................. 257/412 |
| 2003/0141560 | A1 | * | 7/2003 | Sun ............................. 257/410 |

OTHER PUBLICATIONS

M.L. Green, E.P. Gusev, R. Degraeve, E.L. Garfunkel; "Ultrathin(<4 nm) SiO2 and Si–O–N Gate Dielectric Layers For Silicon Microelectronics: Understanding The Processing, Structure, and Physical And Electrical Limits"; Journal of Applied Physics, vol. 90, No. 5, Sep. 1, 2001; pp. 2057–2121.

* cited by examiner

*Primary Examiner*—Eddie Lee
*Assistant Examiner*—Douglas W. Owens

(57) ABSTRACT

The present invention provides a method for manufacturing a semiconductor device comprising an insulating layer that includes a seed layer formed on a substrate. The seed layer is formed by removing hydrogen forming the substrate, depositing a seed layer precursor and exposing the precursor to excited atoms to form a seed layer on the substrate.

5 Claims, 3 Drawing Sheets

SEMICONDUCTOR DEVICE USING AN INSULATING LAYER HAVING A SEED LAYER

TECHNICAL FIELD OF THE INVENTION

The present invention is directed, in general, to semiconductor devices and, more specifically, to a process for forming an insulating layer over a semiconductor substrate that includes forming a seed layer for a high K dielectric.

BACKGROUND OF THE INVENTION

As active device dimensions get smaller, it is desirable to reduce the thickness of a gate insulating layer in such devices. The push toward thinner insulating layers is expected to limit the use of the currently popular conventional gate insulting layer, silicon dioxide. This follows because at some point of diminishing thickness, about 1 to 1.2 nm, the leakage of current through the silicon dioxide insulating layer will become unacceptably high and adversely affect device performance.

One proposed solution is to use gate insulating layers composed of a material with a higher dielectric constant than that of silicon dioxide. Such materials, termed high K dielectrics, have superior insulating characteristics compared to silicon dioxide for equivalent thicknesses, for example, by allowing less leakage current. There are, however, a number of problems with forming gate insulating layers composed of high K dielectric material. For example, it is difficult to depositing high K dielectric materials directly on hydrogen-terminated silicon substrates. To facilitate deposition, typically a template, or seed layer, of silicon dioxide is first formed between the silicon substrate and the high K dielectric material.

Alternatively, the formation of a silicon dioxide layer between the substrate and the high K dielectric may be an unavoidable by-product of the conditions and techniques used to deposit the high K dielectric or underlying seed layer on the silicon substrate. However, the formation of a silicon dioxide layer of about 1 nm or thicker defeats the purpose of switching to a high K dielectric, because the presence of the silicon dioxide layer will again give rise to the above-mentioned problems.

Previous attempts to form thin seed layers to facilitate the deposition of high K dielectrics on silicon substrates are problematic. One approach is thermal nitridation of the silicon substrate surface, to thereby form an oxidation barrier at the silicon substrate-high K dielectric interface. The temperatures used for nitridation, 550° C. and higher, however, are undesirably high for use in conjunction with conventional semiconductor processing steps of, for example, complementary metal oxide semiconductor (CMOS) or metal oxide semiconductor field effect transistor (MOSFET) fabrication. Such temperatures are undesirable because they result in an unacceptably thick seed layer (typically 0.5 to 2 nm) and further result in a high level of positive fixed charge at the semiconductor interface, both of which have deleterious effects on the device performance.

Moreover, nitridation results in the formation of an unacceptably thick nitride layer of more than about 1.5 nm. Others have attempted to incorporate nitride into the silicon substrate using ion implantation. This technique, however, still results in the formation of a silicon nitride layer that is about 0.5 to about 1.0 nm thick. Such thick nitride layers result in unacceptable amounts of positive fixed charge and charge trapping centers, both of which cause scattering of channel carriers and degradation of device performance.

Others have attempted to create a monolayer surface barrier of silicon carbide (SiC). This material is problematic, however, because the presence of carbon at the silicon surface is known to create defect states that have deleterious effects on both the leakage current and device performance. These effects may be mitigated by removing excess carbon, via for example, an oxygen anneal. An oxygen anneal, however, will cause further oxidation of the underlying silicon substrate, resulting in the formation of an undesirable silicon dioxide layer. Additionally, the carbon will itself act as a defect site, and degrade the performance of the device.

Studies of oxynitride gate dielectrics suggest that one monolayer of nitrogen atoms incorporated into a surrounding $SiO_2$ matrix, near a silicon channel interface, improves device performance. The techniques used for oxynitride layer formation, however, also result in the formation of undesirably thick (e.g., 0.5 to 1 nm) silicon dioxide layers at the interface. Furthermore, an oxynitride is not desirable due to its lower dielectric constant than silicon nitride (e.g., about 4.5 compared to about 7.5).

Accordingly, what is needed in the art is a semiconductor device and method of manufacturing thereof that does not exhibit the limitations of the prior art.

SUMMARY OF THE INVENTION

To address the above-discussed deficiencies of the prior art, the present invention provides a method of manufacturing a semiconductor device. The method includes forming an insulating layer over a silicon substrate. Forming the insulating layer includes removing hydrogen atoms from a surface of the silicon substrate to produce a substantially hydrogen-free surface. Forming the insulating layer also includes depositing a seed layer precursor over the substantially hydrogen-free surface. Forming the insulating layer further includes exposing the seed layer precursor on the surface to energized atoms to form a seed layer.

Still another embodiment is directed to an active device comprising a semiconductor substrate, an insulating layer on the semiconductor substrate, a gate electrode located over the insulating layer, and doped region located in the semiconductor substrate. The insulating layer comprises a seed layer having a thickness of about 5 Angstroms or less on the semiconductor substrate and a high K dielectric material on the seed layer.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descrip tions taken in conjunction with the accompanying drawings, in which.

DETAILED DESCRIPTION

Figure 1:
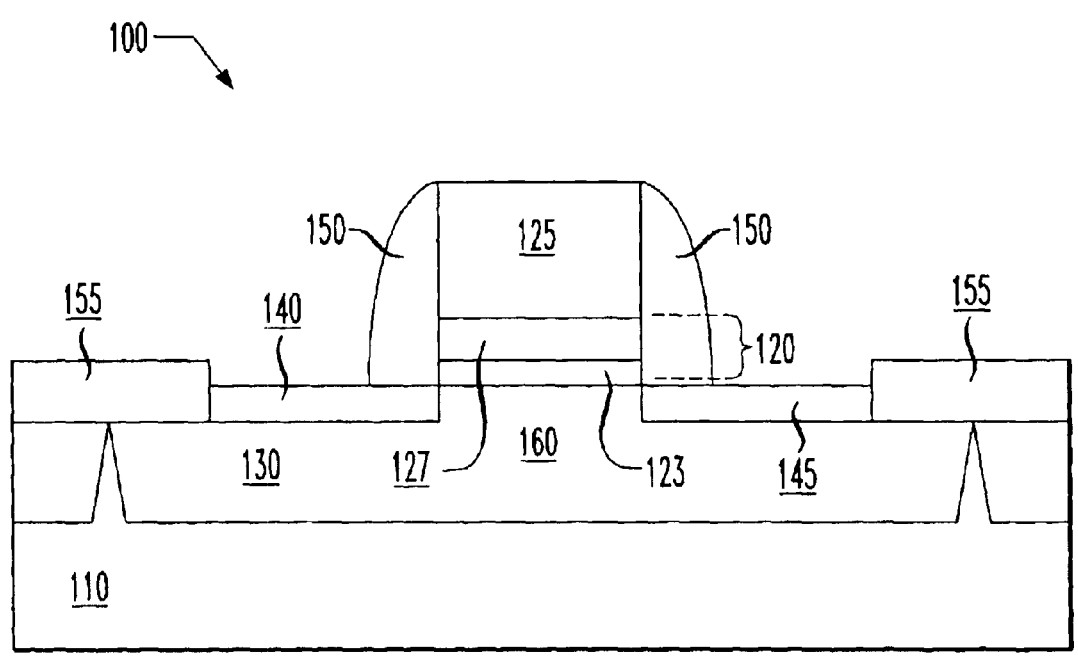
FIG. 1 illustrates a sectional view of an exemplary active device of the present invention.

The present invention is directed to a process for forming an insulating layer in a semiconductor device that includes a seed layer. The seed layer facilitates the deposition of a high K dielectric over the substrate by acting as a template for growing the high K dielectric. The seed layer preferably contains nitrogen or oxygen atoms inserted in the topmost silicon layer, with the dangling bonds completely terminated with hydrogen atoms, thus preventing further oxidation in both the top and underlying substrate layers. This, in turn, retards the formation of an undesirable silicon dioxide layer during the deposition of the seed layer or the overlying high K dielectric layer.

One embodiment of the invention is a method of manufacturing a semiconductor device. The method comprises forming an insulating layer over a semiconductor substrate, such as a silicon substrate that was hydrogen-passivated. In this embodiment, hydrogen atoms are removed from the surface of the silicon substrate to produce a substantially hydrogen-free surface. Thereafter, a seed layer precursor is deposited over the substantially hydrogen-free surface and is exposed to energized atoms to form a seed layer.

The term substantially hydrogen-free surface as used herein refers to a silicon surface having less than about 20 percent, and more preferably less than about 5 percent of its surface atoms bonded to hydrogen. The hydrogen-free surface silicon surface formed is thought to contain highly reactive Si atoms, commonly referred to as dangling silicon bonds, as well known to those skilled in the art.

The semiconductor substrate, when silicon, is typically hydrogen passivated and substantially devoid of surface contamination. The removal or desorption of hydrogen from the surface of the silicon may be achieved using any conventional technique well know to those of ordinary skill, such as exposure to plasma in the presence of an inert gas, such as nitrogen or argon, or using photon-induced desorption (using lasers for instance), or electron-induced desorption, or field-induced desorption using an STM tip or other electrodes, or mechanically-induced using an AFM tip. Removal may also be accomplished by laser thermal heating techniques; photochemistry, or scanning transmission microscopy methods using an atomic-scale probe to remove the surface hydrogen. More preferably, however, removal is achieved by thermal treatment in the presence of a vacuum. Thermal treatment includes heating the silicon substrate to a temperature of a least about 500° C. In certain embodiments, the temperature is between about 550 and about 600° C., although higher temperatures, such as flash heating to about 900 to about 1200° C. and higher temperatures may be used.

A vacuum during the removal is desirable because this reduces the presence of contaminants that may react with the substantially hydrogen-free silicon surface to, for example, form a silicon dioxide layer over the silicon substrate in subsequent processing steps. For example, removing hydrogen atoms advantageously includes exposing the silicon substrate to a vacuum of less than about $1\times10^{-6}$ Torr, and more preferably less than about $1\times10^{-8}$ Torr.

The seed layer precursor may comprise any molecule capable of delivering oxygen or nitrogen atoms or a combination thereof to the surface of the silicon. In certain advantageous embodiments, the seed layer precursor has a chemical formula of $X_mY_n$. X is preferably either a nitrogen or oxygen atom. Y is preferably a monovalent atom selected from the group consisting of: hydrogen, deuterium and group VIIA elements from the periodic table of elements. Subscripts m and n are integers whose values are adjusted to provide the precursor with a substantially neutral charge.

In certain preferred embodiments, for example, the precursor is water or heavy water (e.g., X=O (oxygen), Y=H (hydrogen) or D (deuterium), respectively, with m=1, and n=2), ammonia (e.g., X=N (nitrogen), Y=H (hydrogen), m=1, n=3), or nitrogen trifluoride (e.g., X=N (nitrogen), Y=F (floride), m=1, n=3). In other preferred embodiments, where it is desirable to reduce hot carrier degradation, Y is deuterium. The term charge carrier degradation as used herein refers to the undesirable effects of charge carriers or hot carriers, such as electrons or holes, in a channel. The charge carriers have sufficient energy (e.g., greater than about 2 eV) such that they can remove passivating light atoms such as hydrogen. Deuterium by virtue of its higher mass, compared to hydrogen, resists removal by the charge carriers. Other examples of particularly preferred seed layer precursors include compounds selected from the group consisting of $H_2O$, $D_2O$, $NH_3$, $ND_3$, $NF_3$ and combinatins thereof.

While not limiting the scope of the present invention by theory, it is thought that during deposition of the seed layer precursor, precursor atoms X and Y separately bond to surface silicon atoms on the silicon substrate, and preferably a (100) silicon surface. For example, when the precursor is $NH_3$, —$NH_2$ is bonded to one surface silicon atom, and —H is bonded to the other surface silicon atom. Or, when the precursor is $H_2O$, —OH is bonded to one surface silicon atom and —H is bonded to the other surface silicon atom. Deposition of the seed layer precursor also serves to terminate any remaining dangling silicon bonds with the monovalent Y atom also present in the seed layer precursor or with the energized atoms. Terminating such dangling bonds serves to passivate the silicon substrate surface and thereby prevents oxidation of the surface during this or subsequent processing steps.

In certain advantageous embodiments, depositing the seed layer precursor includes heating to a temperature up to about 400° C., and preferably less than about 350° C. In other embodiments, however, seed layer deposition may be done at room temperature. Temperatures below 400° C. are preferred because they are conducive to forming a thin seed layer on, or into the first few atomic layers of, the silicon substrate, by limiting the extent of diffusion of seed layer precursor atoms into the silicon substrate. For example, at temperatures below about 300° C., there is substantially no incorporation (i.e., less than about ten percent of the atoms comprising the seed layer precursor) of the seed layer molecules, or their component Atomic species, such as oxygen or nitrogen, below the top two surface layers of silicon atoms of the substrate.

In certain embodiments, the precursor is deposited by presenting the precursor to the substrate for between about 0.01 and about $10^9$ Langmuirs, and more preferably for between about 0.1 and about 100 Langmuirs. For the purposes of the present invention, one Langmuir unit is defined as exposure to a quantity of a compound, such as a seed layer precursor, corresponding to $10^{-6}$ Torr for one second. In certain exemplary embodiments, for example, when the seed layer precursor is ammonia ($NH_3$), about 5 Langmuirs of $NH_3$ may be presented by introducing sufficient $NH_3$ into an evacuated chamber containing the silicon substrate to provide a pressure of about $5\times10^{-8}$ Torr for about 100 seconds.

The term energized atoms as used herein refers to atoms that are produced by heat or plasma to change the bonding state of X atoms from the deposited precursor, such as nitrogen or oxygen atoms, with the top silicon layer. For example, the bonding state of the X atoms may be changed, from an adsorbed species involving only one silicon atom, to a bridge bonding between two silicon atoms, such as the above-mentioned surface atoms. Thus, for example, the silicon substrate surface may be rearranged such that the Y atoms previously associated with one of the silicon atoms in a dimer is removed, and both silicon atoms of the silicon dimer are bonded to the X atom. Exposure to the energized atoms also prevents the formation of dangling bonds by providing a monovalent species Y to terminate any dangling bonds formed in the process and thereby reducing formation of silicon dioxide on the silicon surface.

Preferably, the energized atoms comprise hydrogen or deuterium plasma or combinations thereof. Preferably, atomic hydrogen or deuterium may be generated by exposing molecular hydrogen ($H_2$) or deuterium ($D_2$) to a hot filament, or by turning them into a plasma. Alternatively, the energized atoms may be a component of a plasma whose main constituent inert gases, such as nitrogen or argon. Alternatively, pure plasmas of, for example, nitrogen or argon, may be used. Even atomic hydrogen with very low energy (e.g., below thermal energies) may be used.

In certain preferred embodiments, the seed layer precursor over the substantially hydrogen-atom free silicon substrate is exposed to atomic hydrogen or deuterium of between about 0.01 and about $10^9$ Langmuirs, and more preferably for between about 0.1 and about 100 Langmuirs either as a neutral gas or in the form of a plasma. Exposure may occur at temperatures ranging from about $-273°$ C. to about $400°$ C., and preferably between about $0°$ C. and about $300°$ C. For example, exposure may comprise about 400 Langmuirs of $H_2$, by introducing about $1\times10^{-5}$ Torr of $H_2$ for about 40 seconds at room temperature, in the presence of a hot tungsten filament (e.g., greater than about $1700°$ C.), to generate atomic hydrogen.

As noted above, it is desirable for the seed layer to be thin. In certain preferred embodiments, for example, the seed layer has a thickness of about 5 Angstroms or less, and more preferably, between about 1 and 2 Angstroms. In other preferred embodiments, the thickness of the seed layer is between about 1/3 and about 3 monolayers, and more preferably, between about 1/2 and about 1 monolayer.

The term monolayer as used herein, refers to the number of X atoms associated with the surface silicon atoms of the silicon substrate. For example, for a (100) silicon surface, the surface density is about $6.8\times10^{14}$ silicon atoms per $cm^2$. For example, when X is nitrogen the surface density of a 1/3 monolayer seed layer on a (100) silicon surface will equal about $2.3\times10^{14}$ nitrogen atoms per $cm^2$. About one monolayer seed layer or less has a thickness of between about 1 Angstroms and about 2 Angstroms. About three monolayers refers to a substrate having the same surface comprising the original surface silicon atoms bonded to the X atom from the seed layer precursor as discussed above, plus two atomic layers of the silicon substrate that are bonded to X atoms, as silicon nitride or silicon oxide, for example. About three monolayers of nitrogen or oxygen atoms has a thickness of about 5 Angstroms.

Forming the insulating layer may further include depositing a high K dielectric layer on the seed layer. Thus, in certain advantageous embodiments, the seed layer forms a template for a gate dielectric. More preferably, the gate dielectric comprises a high K dielectric material on the seed layer. The term dielectric constant as used herein refers to the multiplicative factor of the dielectric constant of the material of interest, as compared to the dielectric constant of air (about $8.85\times10^{-14}$ Farad/cm). For the purposes of the present invention a high K dielectric material as used herein refers to any material having a dielectric constant higher than the dielectric constant of silicon dioxide. Preferably, the dielectric constant relative to air is at least about 8.

It is advantageous for the high K dielectric material to comprise an element from the periodic table whose oxides are thermodynamically stable on the seed layer and underlying silicon, as discussed in Green et al., Applied Physics Reviews, vol. 90, 2057–2121 (2001), incorporated by reference herein. The high K dielectric may be deposited in step 125 by conventional techniques, well known to those skilled in the art, such as physical chemical deposition, or more preferably, vapor chemical deposition, such as organometallic vapor phase epitaxy or molecular beam epitaxy and more preferably, atomic layer deposition.

It is desirable, for example, for the high K dielectric material to be selected from the group of metal oxides consisting of: aluminum oxide; zirconium oxide; hafnium oxide; titanium oxide; tantalum oxide; yttrium oxide; lanthanum oxide; and combinations thereof. Any of these materials may be combined with silicon dioxide to form metal silicates. Additionally, nitrogen may be incorporated into the film, by methods known to those skilled in the art, to make metal oxynitrides, nitrided metal oxides, with the nitridation at the top surface of the film, or MSiON combinations, where M is any of the metals listed herein.

Particularly preferred high K dielectric materials are aluminum oxides, such as $Al_2O_3$ and zirconium oxides, such as $ZrO_2$, and hafnium oxide, such as $HfO_2$. Desirable combinations of high K dielectric materials include combinations of aluminum and zirconium oxides. Aluminum and zirconium and combined with each other or other high K dielectric materials are particularly advantageous, because they tend to form amorphous structures that are more conductive to minimizing leakage currents. Moreover, one or more of the high K dielectric materials may be combined with silicon oxides, in order to, for example produce a composite material with a dielectric constant between the dielectric constant of silicon oxide and the dielectric constant of the high K dielectric material.

FIG. 1 illustrates an exemplary embodiment of another aspect of the present invention, an active device 100. The device 100 comprises a semiconductor substrate 110, an insulating layer 120, which includes a seed layer 123, and a high-K dielectric material 127, fabricated as described above in or on the semiconductor substrate 110. A conventional gate 125 with spacers 150 adjacent thereto are located over the insulating layer 120. The illustrated exemplary device further includes a conventional doped region 130 located in or on the semiconductor substrate 110.

In certain preferred embodiments the active device 100 is a MOSFET. The doped region, preferably includes conventional source and drain regions 140, 145, respectively, located in or on the semiconductor substrate 110, on either side of the gate 125. In other embodiments, however, the doped region 130 may be a single doped region located within a well. The semiconductor substrate 110 is preferably a silicon substrate, although other semiconductor device substrates, known to those skilled in the art, are also within the scope of the present invention. In such embodiments, the device 100 may further include a conventionally formed channel region 160 between the source and drain 140, 145, spacers 150, and field oxide 155 regions.

The source and drain 140, 145 may be comprised of any conventional materials, such as germanium, gold, nickel and stacked combinations or combinatons thereof. Similarly, any conventional conductive material may be used as the gate 125. Non-limiting examples of gate materials include aluminum, titanium, gold, silver, platinum, refractory metals selected from the group consisting of tungsten, rhenium, tantalum, molybdenum and niobium, a refractory metal silicide of any of the above-mentioned metals, such as $WSi_2$, polysilicon, polycide and combinations thereof.

Any of the methods and preferred embodiments described herein may be used to fabricate the insulating layer 120, including the seed layer 123 of the present invention having the desired thickness in or on silicon substrate 110 in the active device 100. For example, the seed layer 123 preferably comprises nitrogen or oxygen, and the nitrogen or oxygen is bonded to two silicon atoms within the substrate, such as a silicon dimer of (100) silicon as discussed above. As noted above, preferably the nitrogen or oxygen is bonded to silicon atoms in near-surface regions of the substrate. Also as noted previously, the seed layer 123 facilitates deposition of a high K dielectric layer 127 on the seed layer 123.

Figure 2A:
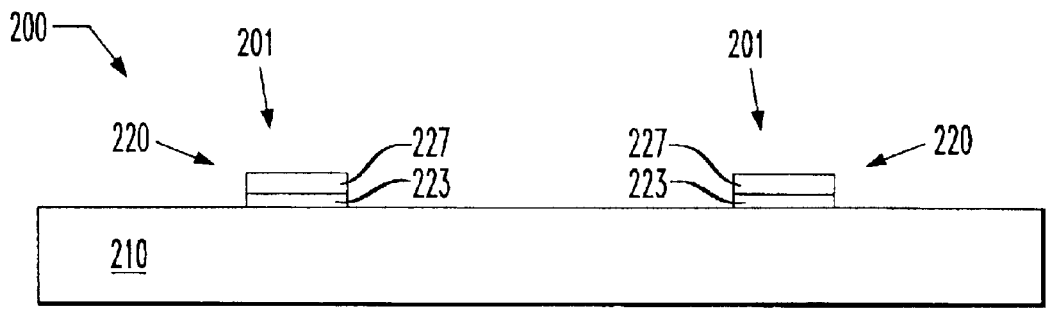
FIG. 2 illustrates selected steps in a method of fabricating an integrated circuit, according to the principles of the present invention.
Figure 2B:
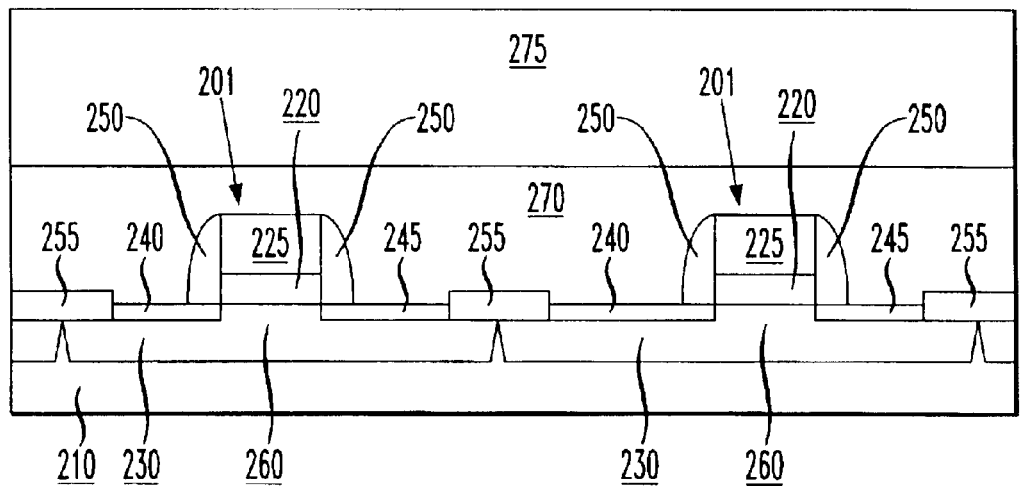
Figure 2C:
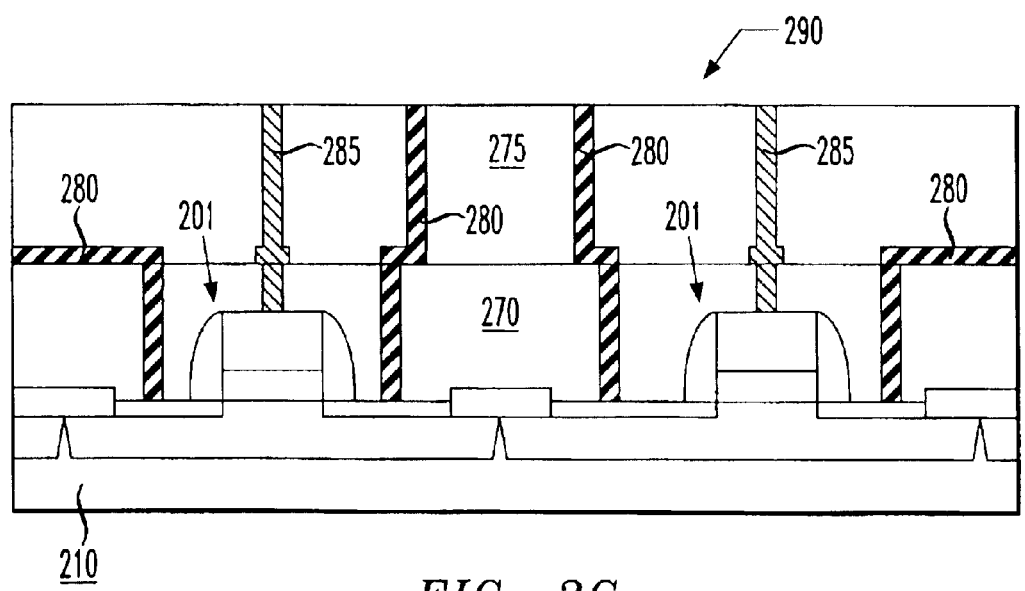

FIGS. 2A to 2C illustrate selected stages of yet another aspect of the present invention, a method of fabricating an integrated circuit 200. Using like numbers to depict structures analogous to that depicted in FIG. 1, FIG. 2A, illustrates forming active devices 201, over and in a semiconductor substrate 210, including forming an insulating layer 220 on the semiconductor substrate 210. Forming the insulating layer 220 includes forming a seed layer 223, and forming a high-K dielectric material 227 over the seed layer 223, as discussed above.

Forming the active device 210 further includes conventionally forming a gate electrode 225 over the insulating layer 220 and forming doped regions 230 in or on the semiconductor substrate 210 (FIG. 2B), which may include source and drain regions 240, 245. Forming the device 210 may also include forming conventional spacer 250 and field oxide 255 regions, as well as channel regions 260. Additional insulating layers 270, 275 may be deposited over the active devices 201 using conventional techniques. As illustrated in FIG. 2C, the method further includes conventionally interconnecting the active devices 201 with interconnect structures 280, 285 to form an operative integrated circuit 290.

Having described the present invention, it is believed that the same will become even more apparent by reference to the following examples. It will be appreciated that the examples are presented solely for the purpose of illustration and should not be construed as limiting the invention. For example, although the experiments described below may be carried out in laboratory setting, one of ordinary skill in the art could adjust specific numbers, dimensions and quantities up to appropriate values for a full scale plant.

EXAMPLES

An exemplary seed layer was prepared according to the principles of the present invention. To fabricate the seed layer, a silicon substrate was heated at about 900° C. for two minutes in a chamber evacuated to a pressure of about 1 to about $2\times10^{-10}$ Torr. The substrate was then exposed to a seed layer precursor of $NH_3$. Silicon substrates were exposed to one of: a) about 4 Langmuirs of atomic H at about −50° C.; b) about 5 Langmuirs of $NH_3$ and subsequently to about 4 Langmuirs of atomic H at −50° C.; and c) to about 90 L $NH_3$ at 500° C., to form about 4 Angstroms of silicon nitride on the Si(100) surface.

Figure 3:
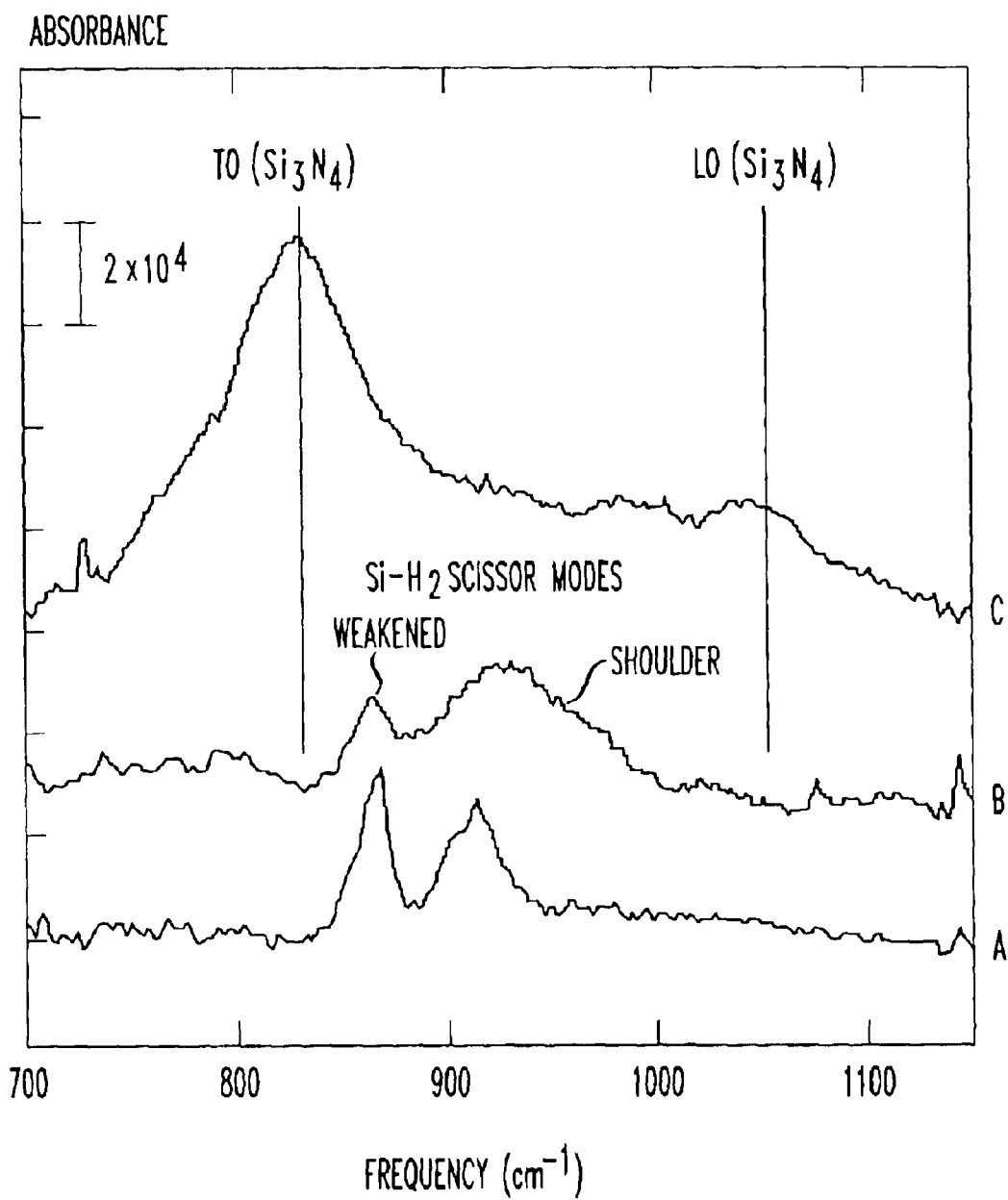
FIG. 3 illustrates an exemplary infrared absorption spectrum of a seed layer surface fabricated according to the principles of the present invention.

The thickness of the seed layer was determined using Infrared Absorption Spectroscopy (IRAS). FIG. 3, graph lines A–C, present exemplary transmission IRAS obtained from a Si (100) surface subjected to the different treatment regimes (a), (b) or (c), as described above. The abbreviations LO and TO in FIG. 3 denote longitudinal-optical and transverse-optical phonon modes of the silicon nitride film, respectively.

Comparison of the Si—$H_2$ scissor modes in FIG. 3, B versus FIG. 3, A shows that hydrogen bonding to the Si surface is affected by the presence of $NH_3$ on the Si(100) surface. This was further supported by changes in the low-frequency Si—H bend region and by high-frequency modes located in the Si—H stretch region of the spectrum (not shown). These spectral changes show that, after H exposure to $NH_3$, N is present in Si surface bonds. Comparison of FIG. 3, B to FIG. 3, C reveals that substantially less N is present in the surface after the $NH_3$—H process in (b) than the equivalent of a 4 Angstrom thick layer of silicon nitride.

Although the present invention has been described in detail, one of ordinary skill in the art should understand that they can make various changes, substitutions and alterations herein without departing from the scope of the invention.

What is claimed is:

1. An active device, comprising:
   a semiconductor substrate; an insulating layer on said semiconductor substrate, said insulating layer comprising:
   a seed layer having a thickness of about 5 Angstroms or less on said semiconductor substrate, wherein said seed layer is on a substantially hydrogen-free surface of said silicon substrate; and
   a high K dielectric material on said seed layer;
   a gate electrode located over said insulating layer; and
   a doped region located in said semiconductor substrate.

2. The active device as recited in claim 1, wherein said seed layer comprises nitrogen or oxygen and said nitrogen or oxygen is bonded to two silicon atoms within said substrate.

3. The active device as recited in claim 1, wherein said thickness is between about ⅓ and about 3 monolayers.

4. The active device as recited in claim 1, wherein said thickness is between about ½ and about 1 monolayer.

5. The active device as recited in claim 1 wherein said doped region includes a source region and a drain region located in said semiconductor substrate.

* * * * *